United States Patent [19]

Spano

[11] Patent No.: US 6,196,677 B1
[45] Date of Patent: Mar. 6, 2001

(54) PARALLEL TEST METHOD

(75) Inventor: John D. Spano, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/082,034

(22) Filed: May 20, 1998

(51) Int. Cl.[7] .................................................. G01R 31/26
(52) U.S. Cl. ........................................... 351/44; 324/754
(58) Field of Search ................................. 324/754, 765, 324/73.1

(56) References Cited

U.S. PATENT DOCUMENTS

| 3,781,683 | * | 12/1973 | Freed | 324/765 |
|---|---|---|---|---|
| 4,829,237 | * | 5/1989 | Segawa et al. | 324/73.1 |
| 4,943,767 | | 7/1990 | Yokota | 324/758 |
| 5,235,271 | * | 8/1993 | Kira | 324/765 |
| 5,321,352 | | 6/1994 | Takebuchi | 324/758 |
| 5,360,747 | | 11/1994 | Larson et al. | 437/8 |
| 5,525,912 | | 6/1996 | Momohara | 324/754 |
| 5,550,480 | | 8/1996 | Nelson et al. | 324/754 |
| 5,566,186 | | 10/1996 | Paterson et al. | 371/25.1 |
| 5,712,858 | | 1/1998 | Godiwala et al. | 371/22.1 |
| 5,818,249 | | 10/1998 | Momohara | 324/762 |

* cited by examiner

Primary Examiner—Glenn W. Brown

(57) ABSTRACT

The present invention is directed to a method and system for testing a plurality of integrated circuits. According to one embodiment of the invention, a method and system for testing a plurality of integrated circuits using a probe card having a plurality of circuit sites is provided. First, a group of the plurality of integrated circuits is associated with the probe card and a first-pass test is performed in parallel on each associated integrated circuit in the group using a first number of signal channels for each circuit site. A particular one of the integrated circuits in the group which passed the first-pass tests is then selectively associated with a particular one of the circuit sites, and a second-pass test is performed on the particular one integrated circuit using a second number of signal channels greater than the first number. In this manner, the use of test system resources may be optimized with expensive second-pass tests (e.g., performance tests) only being performed on circuits passing less-expensive first-pass tests (e.g., BIST and scan tests).

27 Claims, 4 Drawing Sheets

PARALLEL TEST METHOD

The present application is a related application of U.S. patent application Ser. No. 08/992,941, entitled "Parallel Test Method," filed Dec. 18, 1997, now abandoned, the contents of which are herein incorporated by reference.

FIELD OF THE INVENTION

The present invention is generally directed to a method for testing an integrated circuit, and more particularly to a method for parallel testing a plurality of integrated circuits.

BACKGROUND

Delivery of high quality parts and controlling production costs are often competing objectives for semiconductor manufacturers as they are for other types of businesses. One area where these objectives compete is in the testing of wafers and integrated circuit packages.

Various test techniques include sequential chain testing or "scan" testing, and built-in self-testing (BIST). Testers that use scan and/or BIST techniques typically require moderate incremental hardware costs. However, the yield rate for circuits subjected to scan and BIST tests alone is not great enough to proceed from wafer test to package assembly because some circuits may pass the scan and BIST tests and still be inoperable when packaged. Therefore, machine-mode parallel pattern testing and parametric tests are performed after the scan and BIST tests. The drawback to machine-mode and parametric testing is that they require a full complement of tester channels for signals and power. The result is that duplication of expensive test equipment is required to increase test throughput using conventional parallel test technology with microprocessor and VLSI devices.

Conventional parallel testing of microprocessor circuits has been found to be expensive relative to the corresponding increase in testing throughput. As explained above, a large part of the expense is driven by the hardware requirements for machine-mode and parametric testing. In addition, relatively short test times may not justify the hardware expense.

SUMMARY OF THE INVENTION

The present invention is directed to a method and system for testing a plurality of integrated circuits. According to one embodiment of the invention, a method and system for testing a plurality of integrated circuits using a probe card having a plurality of circuit sites is provided. First, a group of the plurality of integrated circuits is registered or associated with the probe card and a first-pass test is performed in parallel on each registered or associated integrated circuit in the group using a first number of signal channels for each circuit site. A particular one of the integrated circuits in the group which passed the first-pass test is then selectively registered or associated with a particular one of the circuit sites, and a second-pass test is performed on the particular one integrated circuit using a second number of signal channels greater than the first number. In this manner, the use of test system resources may be optimized with expensive second-pass tests (e.g., performance tests) only being performed on circuits passing less-expensive first-pass tests (e.g., BIST and scan tests).

The above summary of the present invention is not intended to describe each illustrated embodiment or every implementation of the present invention. The figures in the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
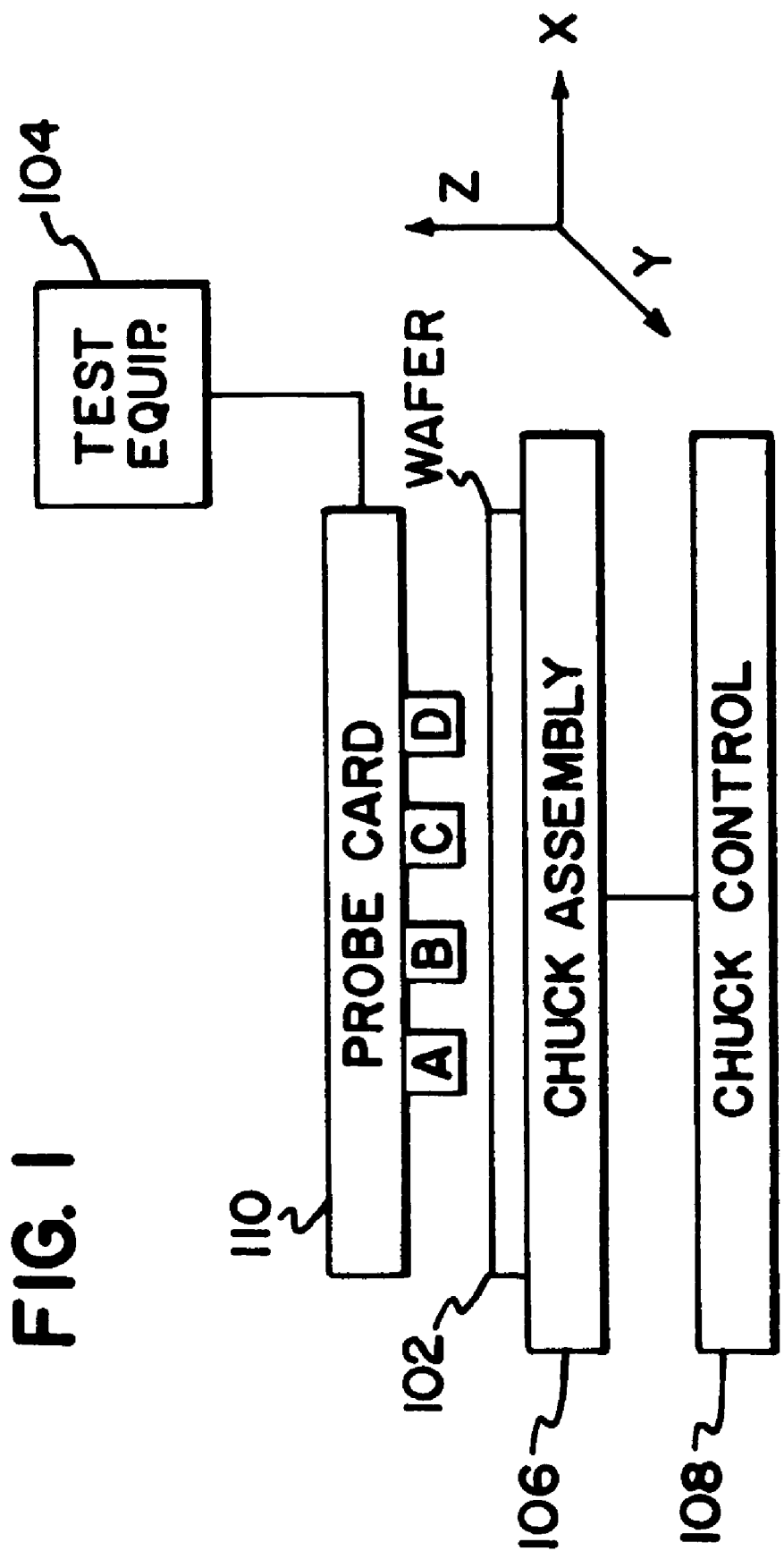
FIG. 1 is a block diagram of an example test system according to an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of arrangements for testing integrated circuits, and believed to be particularly applicable to testing a plurality of integrated circuits on a wafer or a plurality of integrated circuit packages. While the present invention is not limited to such devices, an appreciation of various aspects of the invention will be gained through a discussion of various example embodiments provided below.

The system of FIG. 1 is arranged to test a plurality of integrated circuits present on a wafer 102. Various functional tests are performed under control of test equipment 104. Test equipment 104 generally applies test signals to integrated circuits and determines whether or not the circuits pass predetermined tests. Wafer 102 typically rests on a prober chuck assembly 106, which can be positioned in response to control signals from a chuck control element 108. Chuck assembly 106 and chuck control are conventional apparatus recognized by those skilled in the art. The function of chuck assembly 106 is to position wafer 102 in alignment with example circuit sites A, B, C and D of probe card 110. As illustrated in FIG. 1, chuck assembly is positionable about the X, Y, and Z axes.

Circuit sites A, B, C and D of probe card 110 illustrate an example plurality of test sites that are used for testing a plurality of integrated circuits. Under the control of chuck control element 108, chuck assembly 106 aligns selected integrated circuits on wafer 102 with circuit sites A, B, C and D and electrically registers or associates the selected integrated circuits with the circuit sites. Once wafer 102 is registered or associated with circuit sites A, B, C and D of probe card 110, testing of the predetermined integrated circuits on wafer 102 can commence.

The signal channel configuration associated with circuit sites A, B, C, and D may advantageously be used to enhance testing throughput through recognition that different types of tests require different signal channel resources. Specifically, a first predetermined suite of tests, such as performance tests including, for example, machine-mode microcode, parametric, and speed performance testing, requires a full complement of signal channels. Such performance testing includes, for example, testing to determine the maximum clock rate at which an integrated circuit acceptably performs. Whereas, a second predetermined suite of tests, such as built-in self tests (BIST) and scan tests, require only a subset of a full complement of signal channels. For some of today's circuits, as many as 300 signal channels may be required for the first type of tests, while as few as 16 signal channels may be required for the second type of tests.

In the example embodiment, circuit site A is a full circuit site, arranged for use with a full complement of signal channels, and circuit sites B–D are partial circuit sites, arranged for use with only a subset of a full complement of signal channels. Full circuit site A is used for both the first and second type of tests, while partial circuit sites B–D are used only for the second type of tests.

According to one aspect of the invention, test resources are leveraged by performing first-pass tests, for example BIST and scan tests, in parallel (simultaneous in time) on a plurality of integrated circuits registered in or associated with circuit sites A–D. After first-pass testing is complete for all die, second-pass testing is performed on the circuits that passed the first-pass tests, using circuit site A and a full complement of signal channels. In this manner, the use of test system resources may be optimized with expensive second-pass tests (e.g., performance tests) only being performed on circuits passing less-expensive first-pass tests (e.g., BIST and scan tests).

Figure 2:
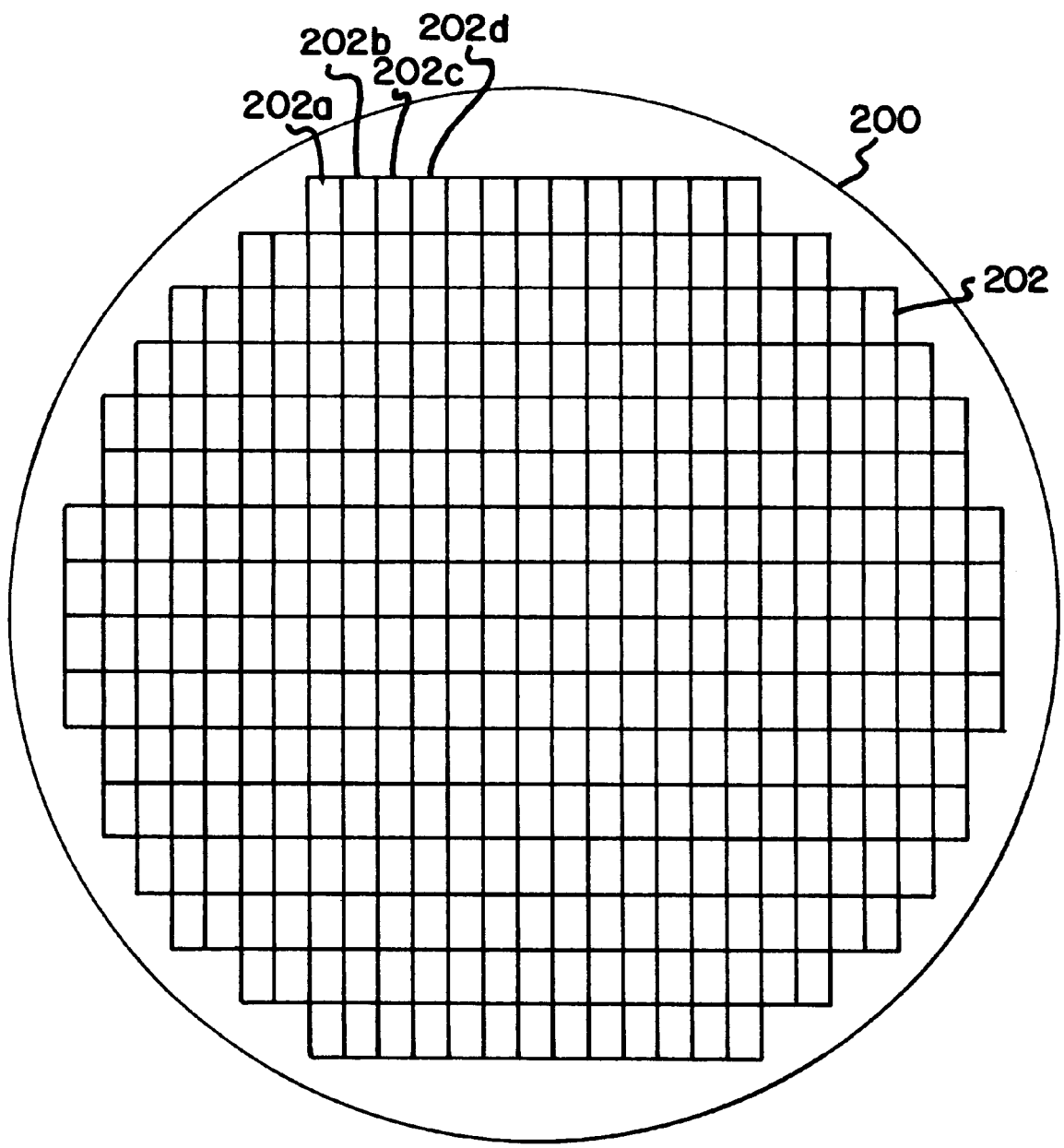
FIG. 2 is a top view of an example wafer to be tested according to an embodiment of the present invention.

FIG. 2 is a top view of an example wafer to be tested in accordance with the present invention. Wafer 200 includes a plurality of integrated circuits 202 or "die sites" to be tested. Example die sites 202a, 202b, 202c, and 202d are examples of a first set of die sites to be aligned and registered, or associated, with probe card 110 of FIG. 1. Specifically die site 202a is initially aligned and registered with circuit site A, die site 202b is initially aligned and registered with circuit site B, die site 202c is initially aligned and registered with circuit site C, and die site 202d is initially aligned and registered with circuit site D.

In a first iteration of first-pass testing, die sites 202a, 202b, 202c, and 202d are all tested in parallel. The identity of die that passed the first-pass testing is then recorded. Then, another group of four die sites are selected for first-pass testing. The process is repeated until all die sites have been first-pass tested.

When first-pass testing is complete, second-pass testing commences. First, a die that passed the first-pass test is selected. Then, the chuck is aligned with the probe card to register, or associated with, the selected die with circuit site A. Second-pass tests are then performed on the die. If the die passed the second-pass test, its identity is recorded, and another die that passed the first-pass test is selected and then registered in site A for second-pass testing. Note that for both first-pass and second-pass testing, test status information for each individual die is recorded by test equipment 104 for further usage.

Figure 3:
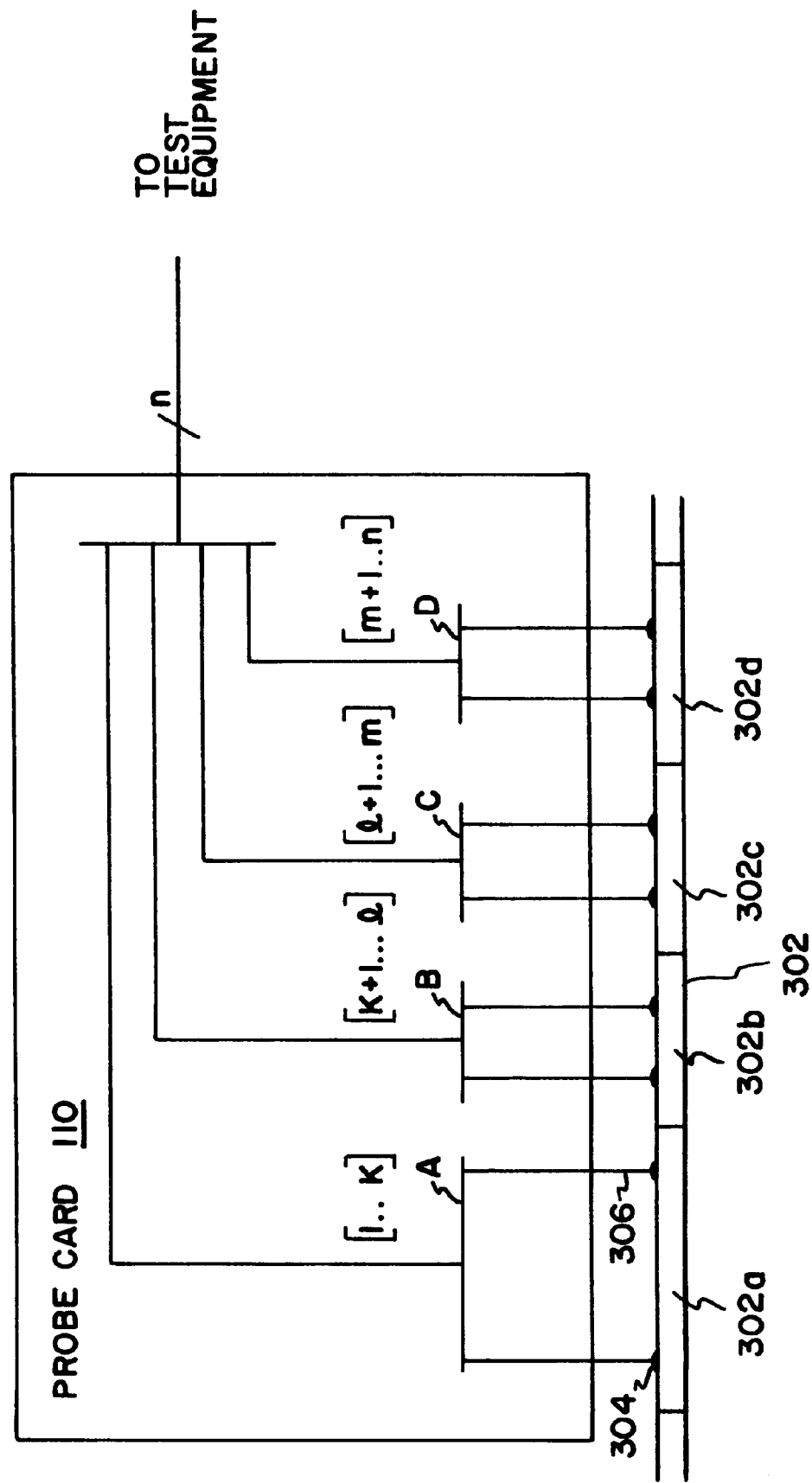
FIG. 3 is a block diagram of an example probe card in accordance with the present invention.

FIG. 3 illustrates an exemplary signal channel arrangement for an example probe card according to the present invention. Probe card 110 includes an example plurality of circuit sites A, B, C and D in registration, or association, with a wafer 302. In the illustrated embodiment, die sites 302a, 302b, 302c, and 302d are registered with circuit sites A, B, C and D, respectively. Wafer 302 may include metal interconnects 304, such as solder bumps or aluminum pads, for making electrical connections to pins of the probe card. Probe card 110 typically includes a plurality of conventional pins or needles, such as needle 306, for registering with metal interconnects of wafer 302. While the circuit sites A–D themselves are conventional, it will be recognized that the usage of the circuit sites as well as the arrangement of signal channels is novel.

The exemplary probe card 110 couples to n signal channels. Each probe card needle 306 is connected to and associated with one of the signal channels [1 . . . n]. In the example probe card 110, a full complement of signal channels, designated as [1 . . . k], is coupled to full circuit site A, a subset [k+1 . . . l] of the n signal channels is coupled to circuit site B, a subset [l+1 . . . m], is coupled to circuit site C, and a subset [m+1 . . . n], is coupled to D. Of the n signal channels, circuit sites A–D have physically exclusive subsets thereof for performing first-pass tests in parallel. Specifically, signal channels [1 . . . k] are physically exclusive of signal channels [k+1 . . . l], [l+1 . . . m], and [m+1 . . . n]; signal channels [k+1 . . . l] are exclusive of [1 . . . k], [l+1 . . . m], and [m+1 . . . n]; signal channels [l+1 . . . m] are exclusive of signal channels [1 . . . k], [k+1 . . . l], and [m+1 . . . n]; and signal channels [m+1 . . . n] are exclusive of [1 . . . k], [k+1 . . . l], and [l+1 . . . m].

The signal channels [k+1 . . . l], [l+1 . . . m], and [m+1 . . . n], while physically exclusive from one another, are functionally the same. That is the signal channels perform the same function relative to devices in the respective partial circuit sites B–D. Similarly, a subset of the signal channels [1 . . . k] is functionally the same as signal channels [k+1 . . . l], [l+1 . . . m], and [m+1 . . . n], but only when performing first-pass tests. Thus, the signal channel subsets [k+1 . . . l], [l+1 . . . m], and [m+1 . . . n] are functional subsets of the full complement of signal channels [1 . . . k]. This permits the first-pass tests to be performed in parallel, and economically so, because the first-pass tests require far fewer testing resources than the second-pass tests.

While partial circuit sites B–D are shown as having fewer than a full complement of signal channels, it will be recognized that the partial circuit sites typically, but not necessarily, require electrical connections for all metal interconnects on the integrated circuits inserted therein. That is, for some integrated circuit die designs, unused metal interconnects cannot float during testing. Therefore, for example, partial circuit site B is usually coupled to circuitry (not shown) in addition to signal channels [k+1 . . . l]. The additional circuitry is used to keep the metal interconnects of a die at ground or at a predetermined voltage level during testing. The additional circuitry is separate from the illustrated n signal channels, and it will be appreciated that the number of additional electrical channels for each of circuit sites B–D is typically determined by the number of probe card pins that are not used for parallel testing.

Figure 4:
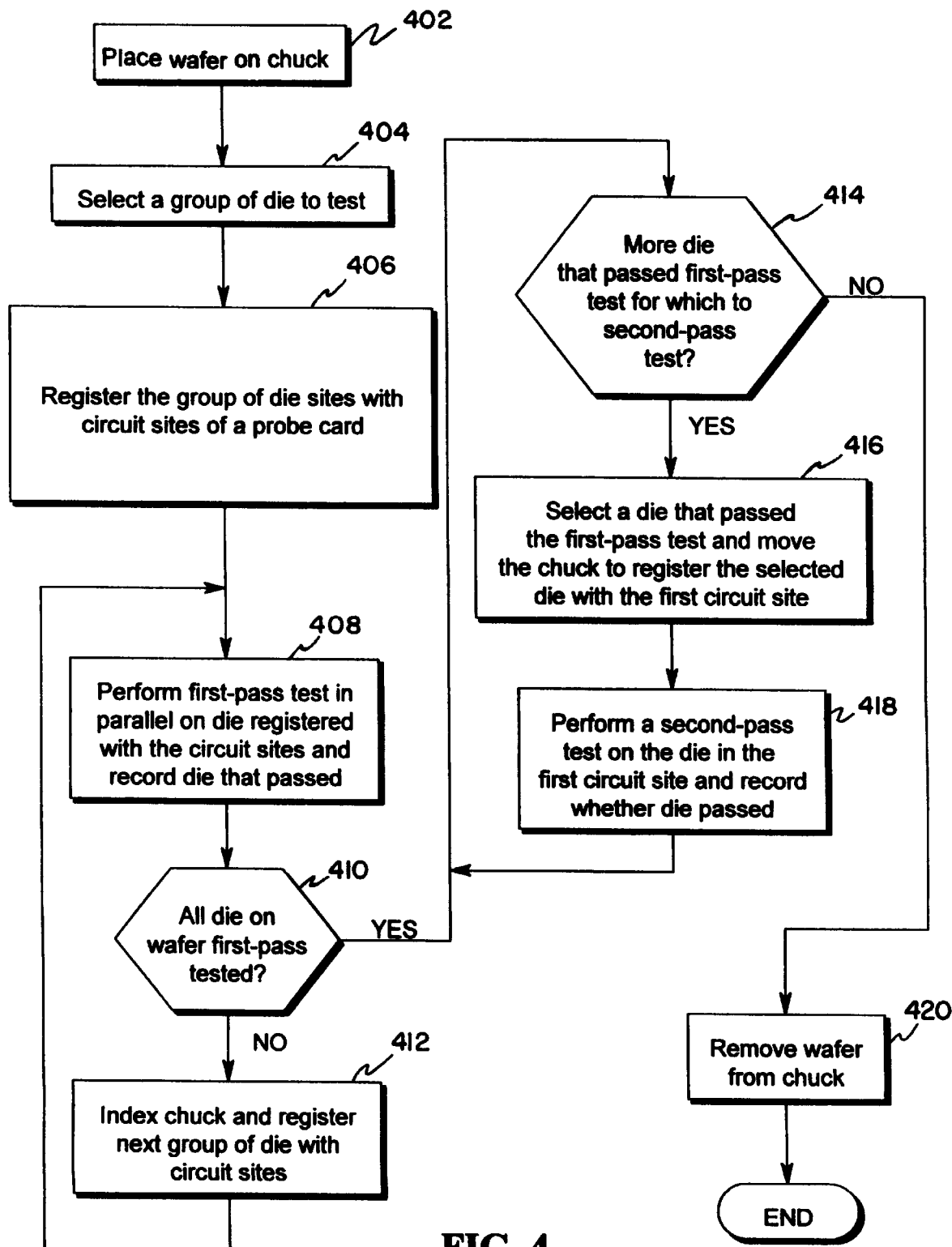
FIG. 4 is a flow chart of an example method according to the present invention.

FIG. 4 is a flow chart of an example method for testing integrated circuits according to an embodiment of the present invention. At block 402 a wafer having a plurality of integrated circuits is placed on a chuck. A group of die sites comprising the integrated circuits to test is selected at block 404. A probe card, as described in FIGS. 1 and 3, is used to test the die sites in the group. At block 406, the group of die sites is registered with circuit sites of the probe card. At block 408, under control of test equipment 104, a first-pass test is performed in parallel on die that are registered with the circuit sites of the probe card. The first-pass tests typically include tests requiring fewer test system resources (e.g., fewer signal channels per circuit site) such as BIST and scan tests. The identity of die that passed the first-pass testing are recorded for indicating that second-pass testing should be performed. Second-pass testing is typically performed after first-pass testing is complete for the die on the wafer. After the first-pass test on the registered die is complete, processing continues at block 410.

Processing continues with performing first-pass tests on the remaining die on the water. As long as there remain die for which first-pass testing is to be performed, block 410 directs control to block 412. The next group of die on which first-pass testing is to be performed is selected at block 412, and processing is then directed back to block 408 where the first-pass test is performed in parallel on the next group of die.

When first-pass tests have been performed on the desired die, block 410 directs processing to control block 414. Block 414 begins a processing loop for performing second-pass tests on the die that passed the first-pass tests. While there remain die that passed the first-pass test on which second-pass testing is to be performed, block 414 directs processing to block 416. A die that passed the first-pass test is selected at block 416, and the chuck is moved to register the selected die with the circuit site A. Recall the circuit site A has a full complement of pins for performing desired testing. At block 418, the second-pass test is performed on the die and the test status is recorded for later reference. The second pass test typically requires larger test resources (e.g., a full complement of signal channels) and may be a machine-mode microcode, parametric, and/or speed performance test, for example. Processing then continues at control block 414.

When second-pass testing is completed, control is directed to block 420 where the wafer is removed from the chuck. Another wafer may then be inserted and the above described processing repeated.

The above described invention is advantageous because the probe card leverages test resources for performing the first-pass tests in parallel. In the second pass, the high cost, performance oriented testing is performed only on die that passed the first pass testing, and the expensive test resources of the test site having the full complement of signal channels are not applied to bad die as identified in the parallel first pass testing.

As noted above, the present invention is applicable to a variety of arrangements for testing integrated circuits. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

I claim:

1. A method for testing a plurality of integrated circuits using a probe card having a plurality of circuit sites, comprising:
   a) associating with the probe card a group of the plurality of integrated circuits;
   b) performing a first-pass test in parallel on each associated integrated circuit in the group using a first number of signal channels for each circuit site;
   c) selectively associating with a particular one of the circuit sites a particular one of the integrated circuits in the group which passed the first-pass test; and
   d) performing a second-pass test on the particular one integrated circuit using a second number of signal channels greater than the first number.

2. The method of claim 1, further including repeating (a)–(b) until all the integrated circuits have been first-pass tested prior to performing the selectively associating step.

3. The method of claim 2, further including repeating steps (c)–(d) for each integrated circuit which passes the first-pass test.

4. The method of claim 3, wherein the steps (c) and (d) are performed only on die that passed the first-pass test.

5. The method of claim 1, wherein the plurality of integrated circuits are die on a wafer.

6. The method of claim 1, wherein the first-pass test includes a sequential chain test.

7. The method of claim 6, wherein the first-pass test includes a built-in self-test.

8. The method of claim 7, wherein the second-pass test is a performance test.

9. The method of claim 1, wherein the first-pass test includes a built-in self-test.

10. The method of claim 9, wherein the second-pass test is a performance test.

11. The method of claim 1, wherein the second-pass test is a performance test.

12. The method of claim 1, wherein the step of performing a second-pass test includes using a first circuit site of the probe card adapted to perform the second-pass circuit test on the particular integrated circuit.

13. The method of claim 12, wherein the first circuit site is adapted to provide a subset of a full complement of first signal channels during the first pass test and is adapted to provide the full complement of the first signal channels during the second pass test.

14. The method of claim 12, wherein the first circuit site is adapted to provide a full complement of first signal channels during the first pass test and is adapted to provide a subset of the full complement of the first signal channels during the second pass test.

15. A method for testing a plurality of integrated circuits using a probe card having a plurality of circuit sites, comprising:
   a) associating with the probe card a group of the plurality of integrated circuits;
   b) performing a first-pass test in parallel on each associated integrated circuit in the group using a first number of signal channels for each circuit site;
   c) repeating (a) and (b) until the first-pass test is performed on all of the integrated circuits;
   d) selectively associating with a particular one of the circuit sites a particular one of the integrated circuits in the group which passed the first-pass test;
   e) performing a second-pass test on the particular one integrated circuit using a second number of signal channels greater than the first number; and
   f) repeating steps (d) and (e) until the second-pass test is performed on each integrated circuit which passed the first-pass test.

16. The method of claim 15, wherein the step of performing a second-pass test includes using a first circuit site of the probe card adapted to perform the second-pass circuit test on each integrated circuit.

17. A testing system for testing a plurality of integrated circuits using a probe card having a plurality of circuit sites, comprising:
   a) means for associating with the probe card a group of the plurality of integrated circuits;
   b) means for performing a first-pass test in parallel on each associated integrated circuit in the group using a first number of signal channels for each circuit site;
   c) means for selectively associating with a particular one of the circuit sites a particular one of the integrated circuits in the group which passed the first-pass test; and
   d) means for performing a second-pass test on the particular one integrated circuit using a second number of signal channels greater than the first number.

18. The testing system of claim 17, further including means for repeating (a)–(b) until all the integrated circuits have been first-pass tested prior to performing the selectively associating step.

19. The testing system of claim 18, further including means for repeating (c)–(d) for each integrated circuit which passes the first-pass test.

20. The testing system of claim 18, further including means for performing (c) and (d) only on die that passed the first-pass test.

21. The testing system of claim 20, wherein the first-pass test includes a built-in self-test.

22. The testing system of claim 20, wherein the second-pass test is a performance test.

23. The testing system of claim 17, wherein the second-pass test is a performance test.

24. The testing system of claim 17, wherein said means for performing the second-pass test includes using one of the circuit sites of the probe card to perform the second-pass circuit test on the particular integrated circuit.

25. The testing system of claim 24, wherein the circuit sites of the probe card include a first circuit site adapted to provide a full complement of first signal channels and a second set of circuit sites adapted to provide a subset of the full complement of the first signal channels.

26. The testing system of claim 24, wherein the circuit sites of the probe card include a first circuit site adapted to provide a subset of the full complement of first signal channels during the first pass test and adapted to provide the full complement of the first signal channels during the second pass test.

27. A testing system for parallel testing integrated circuits, comprising:

a probe card having a plurality of circuit sites, each circuit site having a plurality of signal channels;

a chuck for holding a wafer having a plurality of integrated circuits; and test equipment, coupled to the probe card and chuck, configured to:

associate with the probe card a group of the plurality of integrated circuits;

perform a first-pass test in parallel on each associated integrated circuit in the group using a first number of signal channels for each circuit site;

selectively associate with a particular one of the circuit sites a particular one of the integrated circuits in the group which passed the first-pass test; and perform a second-pass test on the particular one integrated circuit using a second number of signal channels greater than the first number.

* * * * *